(12) United States Patent
Zitlaw

(10) Patent No.: US 8,244,964 B2
(45) Date of Patent: Aug. 14, 2012

(54) READ PREAMBLE FOR DATA CAPTURE OPTIMIZATION

(75) Inventor: Clifford Alan Zitlaw, Chico, CA (US)

(73) Assignee: Spansion LLC, Sunnyvale, CA (US)

(*) Notice: Subject to any disclaimer, the term of this patent is extended or adjusted under 35 U.S.C. 154(b) by 299 days.

(21) Appl. No.: 12/646,279

(22) Filed: Dec. 23, 2009

(65) Prior Publication Data
US 2011/0153915 A1 Jun. 23, 2011

(51) Int. Cl.
*G06F 12/00* (2006.01)
*H04L 12/56* (2006.01)

(52) U.S. Cl. .............. 711/103; 370/389; 711/E12.001

(58) Field of Classification Search .......... 711/103, 711/5, E12.001; 365/193, 49; 360/51; 370/389
See application file for complete search history.

(56) References Cited

U.S. PATENT DOCUMENTS

| | | | |
|---|---|---|---|
| 6,252,733 B1 * | 6/2001 | Staszewski | 360/51 |
| 6,791,888 B2 * | 9/2004 | Kang | 365/193 |
| 7,394,721 B1 | 7/2008 | Vemula | |
| 7,558,133 B2 | 7/2009 | Choi et al. | |
| 7,590,789 B2 | 9/2009 | Rashid | |
| 7,636,274 B2 | 12/2009 | Solomon et al. | |
| 8,018,931 B2 * | 9/2011 | Yamauchi et al. | 370/389 |
| 2001/0010604 A1 * | 8/2001 | Esumi | 360/49 |
| 2009/0034344 A1 * | 2/2009 | Nguyen et al. | 365/193 |
| 2010/0182855 A1 * | 7/2010 | Koshizuka | 365/193 |

* cited by examiner

*Primary Examiner* — Pierre-Michel Bataille
(74) *Attorney, Agent, or Firm* — Turocy & Watson, LLP (57) ABSTRACT

Systems and/or methods are provided that facilitate data capture optimization for devices accessing memories via a bus. In an aspect, a memory can output a read preamble prior to pushing data onto a bus. The read preamble can be a known sequence of one or more bits. A host device accessing the memory via the bus can analyze the read preamble and, particularly, timing characteristics of the read preamble. The timing characteristics can be utilized to identify an optimal capture point within a window of data validity.

19 Claims, 9 Drawing Sheets

READ PREAMBLE FOR DATA CAPTURE OPTIMIZATION

TECHNICAL FIELD

The subject innovation relates generally to memory systems and, in particular, to systems and methods that enable data capture optimization via read preambles.

BACKGROUND

A wide variety of memory devices can be used to maintain and store data and instructions for various computers and similar systems. In particular, FLASH memory is a type of electronic memory media that can be rewritten and that can retain content without consumption of power. Unlike dynamic random access memory (DRAM) devices and static random memory (SRAM) devices in which a single byte can be altered, FLASH memory devices are typically erased in fixed multi-bit blocks or sectors. FLASH memory technology can include NOR FLASH memory and/or NAND FLASH memory, for example. FLASH memory devices typically are less expensive and denser as compared to many other memory devices, meaning that FLASH memory devices can store more data per unit area.

FLASH memory has become popular, at least in part, because it combines the advantages of the high density and low cost of erasable programmable read-only memory (EPROM) with the electrical erasability of EEPROM. FLASH memory is nonvolatile; it can be rewritten and can hold its content without power. It can be used in many portable electronic products, such as cell phones, portable computers, voice recorders, thumbnail drives and the like, as well as in many larger electronic systems, such as cars, planes, industrial control systems, etc. The fact that FLASH memory can be rewritten, as well as its retention of data without a power source, small size, and light weight, have all combined to make FLASH memory devices useful and popular means for transporting and maintaining data.

FLASH memory arrays can be employed with a variety of interfaces or bus designs. For instance, a serial FLASH memory is becoming increasingly popular due to an efficient signal interface and cost effective packages. For example, a serial peripheral interface (SPI) has gained industry acceptance due to a low pin count and high clock rates. SPI FLASH memory is utilized by chipset vendors requiring reduced pin-counts and customers demanding lower cost solutions. For instance, SPI can provide a lowest pin-count solid state FLASH memory solution which equates to smaller board area and minimal signals to route. As system-on-a-chip (SoC) integrate more and more features, a low-pin count and low cost memory solution is attractive.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Systems and/or methods are disclosed that facilitate data capture optimization for devices accessing memories via a bus. In an aspect, a memory can output a read preamble prior to pushing data onto a bus. The read preamble can be a known sequence of one or more bits. A host device accessing the memory via the bus can analyze the read preamble and, particularly, timing characteristics of the read preamble. The timing characteristics can be utilized to identify an optimal capture point within a window of data validity.

In another aspect, a serial memory that employs a serial peripheral interface (SPI) bus is provided. The serial memory can output a read preamble during a latency period generated while data is obtained from a memory array. The read preamble can be driven onto the SPI bus prior to the data from the memory array. The read preamble enables a host device on the SPI bus to derive an optimal capture skew to increase throughput of the serial memory.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Systems and/or methods are presented that facilitate employing a read preamble to optimize data capture. In particular, a host controller (e.g., a device utilizing a memory) can skew a capture point across a data valid period to identify an appropriate point. To facilitate data capture optimization, the memory can place the preamble on a bus prior to driving target data. The preamble can be a known data pattern that enables the host controller to determine when valid data is presented on a bus and duration of the valid data. The host controller can identify a data capture point within the valid data window.

Figure 1:
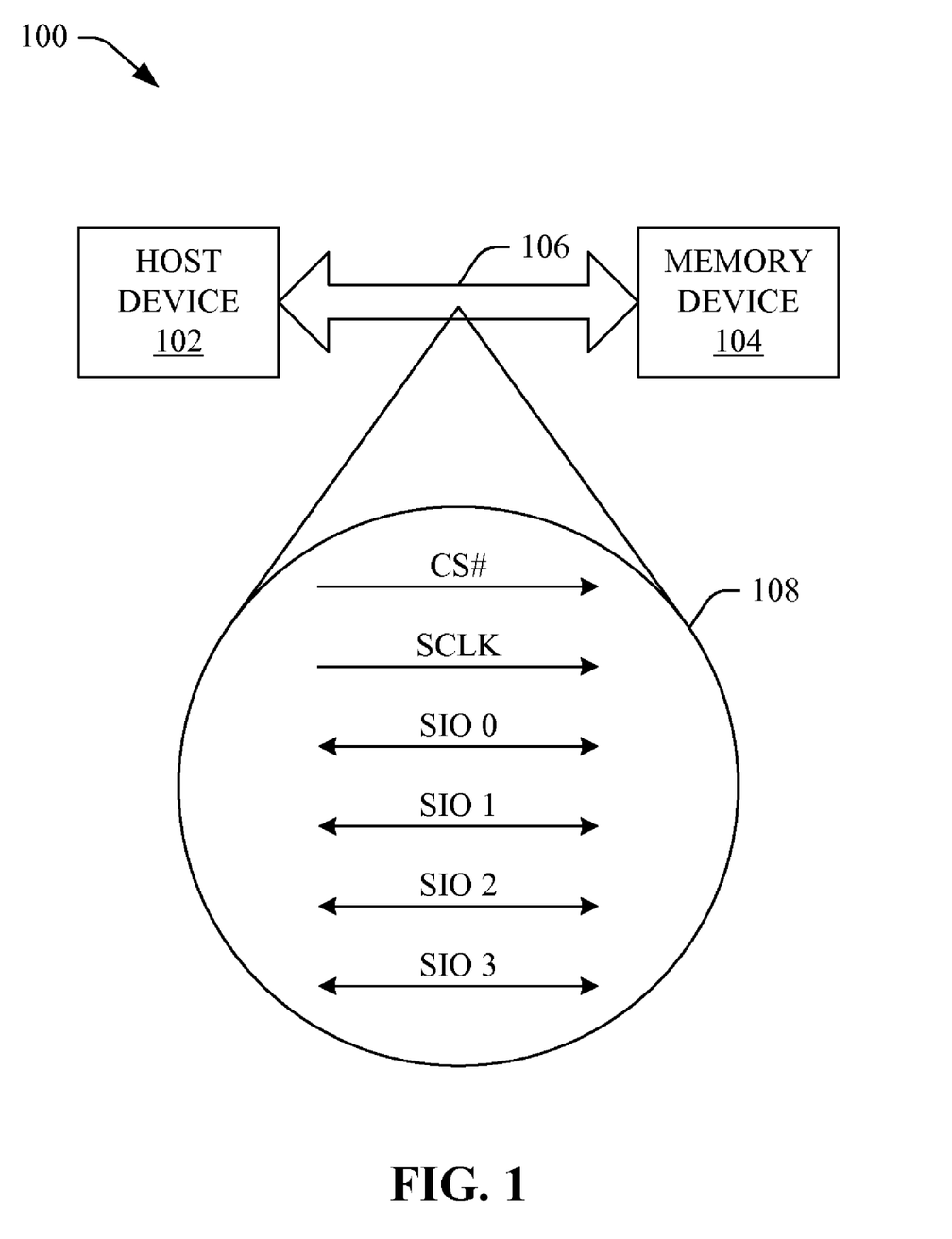
FIG. 1 illustrates a high-level block diagram of a system for utilizing data training to optimize capture in accordance with various aspects.

Referring initially to FIG. 1, illustrated is a system 100 for utilizing data training to optimize capture in accordance with various aspects. System 100 can include a host device 102 which communicates with a memory device 104 via a bus or interface 106. The host device 102 can include devices such as, but not limited to, a computer, a chipset, a system-on-a-chip, a memory controller, an integrated circuit, and/or any other suitable device capable of communicating, accessing, and/or utilizing the memory device 104. According to an example, the memory device 104 can be a non-volatile, solid state memory device, such as a FLASH memory device. However, it is to be appreciated that memory device 104 can employ disparate non-volatile memory structures. For instance, memory device 104 can be a read-only memory (ROM), a programmable ROM (PROM), an erasable PROM (EPROM), or an electrically EPROM (EEPROM). In another example, memory device 104 can be a non-volatile memory distinct from ROM or FLASH, such as, but not limited to, ferroelectric RAM (FeRAM), magnetoresistive RAM (MRAM), SONOS, or the like. In addition, aspects disclosed herein can be employed with volatile memory such as dynamic random access memory, static random access memory, or the like. Moreover, it is to be appreciated that host device 102 can employ aspects described herein with non-memory peripheral devices. For instance, the host device 102 can perform a read operation in connection with a temperature sensor or other sensor, a timer, an analog to digital converter, etc.

The host device 102 and memory device 104 can interact via the bus or interface 106. The host device 102 and memory device 104 can exchange signals or bits via the bus 106. In accordance with an aspect, bus 106 can be a serial peripheral interface (SPI). An example SPI bus is depicted in a breakout portion 108 of FIG. 1. Accordingly to this example, the SPI bus can include a chip select (CS#) line, a serial clock (SCLK) line, and one or more serial input/output (SIO) lines. Although four SIO lines are depicted (e.g. SIO 0-3), it is to be appreciated that the SPI bus is not constrained to four SIO lines, nor are the claims intended to be limited to implementations including four lines. Rather, the SPI bus can include any number of input/output lines greater than or equal to one.

Pursuant to an example, the host device 102 can select memory device 104 via the CS# line. In an aspect, the host device 102 can communicate with multiple devices (not shown) via the bus 106. In this regards, the host device 102 utilizes the CS# line to enable one device on the bus 106 to avoid contention. The CS# line can be an active low signal such that the host device 102 drives the CS# line low to select or enable memory device 104. Once selected, the memory device 104 can utilize the bus 106 to communicate with the host device 102.

The SCLK line can carry a clock signal that provides timing and synchronization. The clock signal can be generated by the host device 102 or by another module (not shown) associated with bus 106. The clock signal can provide a reference for the host device 102 and the memory device 104 during operations such as a read operation, a write operation, an erase operation, etc. For instance, a protocol can be established in terms of clock pulses of the clock signal, wherein the protocol instructs the memory device 104 and/or the host device 102 when to push data onto the SIO lines, what data to push, and how quickly to transition data. The SIO lines (e.g., SIO 0-3) can carry data signals, command signals, address signals, or the like. The SIO lines can be driven by either the host device 102 or the memory device 104. For instance, the host device 102 can drive the SIO lines to convey a command and/or a memory address to the memory device 104. The memory device 104 can drive the SIO lines to convey data bits retained in a memory array.

According to another example, a read operation on a legacy SPI bus can be tethered to the clock signal carried on the SCLK line. For instance, during a read operation, the memory device 104 can output data to bus 106 (e.g., on a SIO line) upon a low going clock edge (e.g., a transition, from high to low, of the clock signal). At a subsequent low going clock edge, the host device 102 can latch or capture the data. However, as clock frequency increases, a period of the clock signal decreases such that a time available for available data capture also shrinks.

In another example, data capture can be untethered from the clock signal. For instance, the host device 102 need not utilize a falling clock edge to capture data output by the memory device 104. According to this example, the host device 102 can find an optimal moment to sample data on bus 106. To facilitate determination of an appropriate data capture moment, the memory device 104 can output a read preamble prior to output of target data. In an aspect, the read preamble can be a known data pattern that enables the host device 102 to determine when data on bus 106 transitions into and out of a valid state. Once the host device 102 identifies when data becomes valid on bus 106 and then goes invalid, the host device 102 can configured a capture skew that corresponds to an optimal time to sample data on bus 106.

Figure 2:
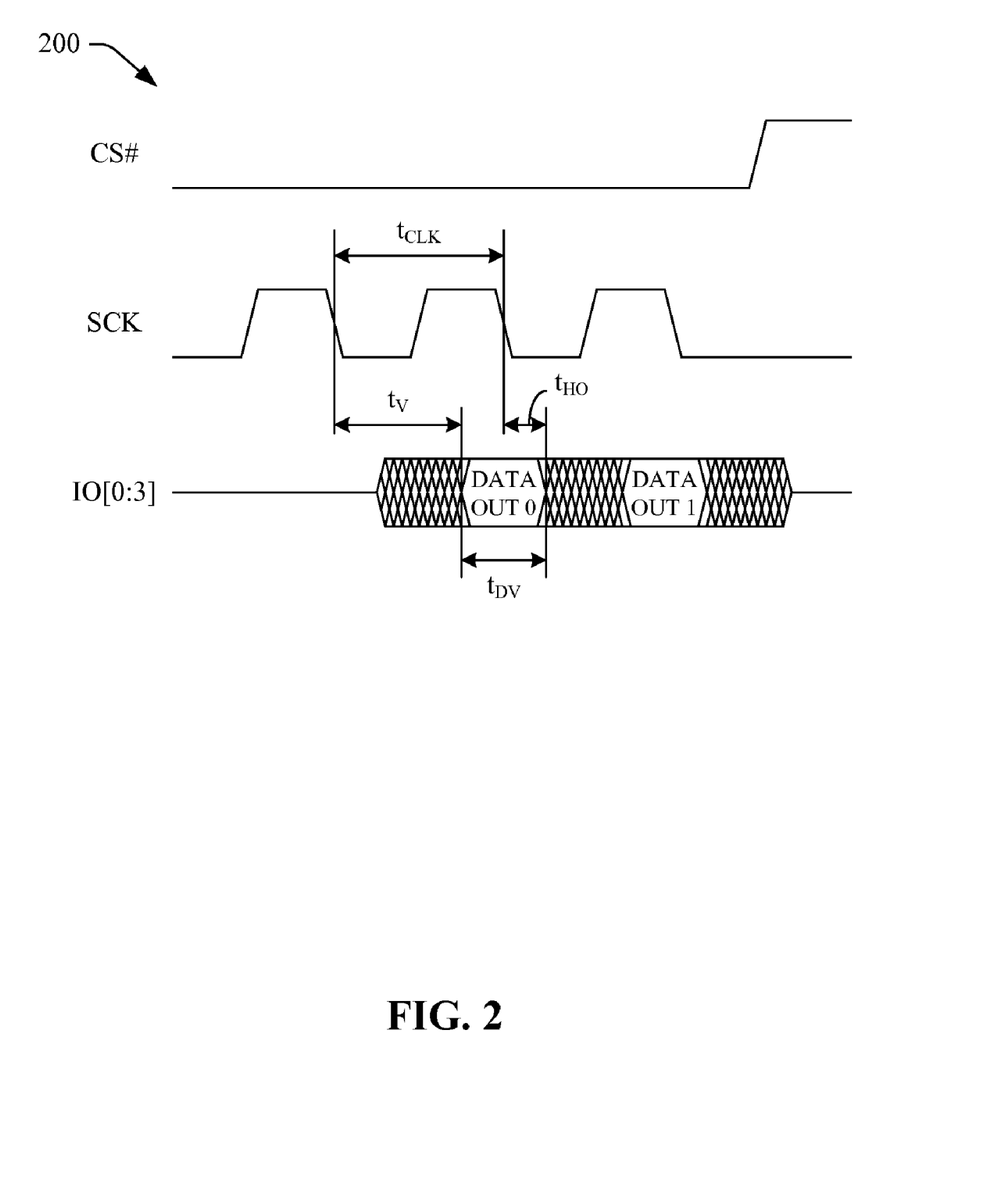
FIG. 2 depicts an example timing diagram illustrating data validity in accordance with various aspects.

Referring now to FIG. 2, a timing diagram 200 is illustrated in accordance with various aspects. The timing diagram 200 depicts data validity during a read operation on a legacy SPI bus. As shown in FIG. 2, validity of data on input/output line(s) (IO[0:3]) can be described relative to falling edges of a clock signal (SCK). Typically, as development of SPI devices progresses, a clock period ($t_{CLK}$) continues to become shorter while clock to data valid time ($t_V$) and data hold time ($t_{HO}$) remain relatively constant. The clock to data valid time, $t_V$, specifies a time duration between a falling clock edge to a time data becomes valid on the IO lines. As discussed above, during legacy SPI read operations, new data (e.g., data out 0, data out 1, etc.) is output by a memory device (e.g., memory device 104) upon each low going clock edge and latched by a host (e.g., host device 102). This data capture strategy is sufficient when the clock to data valid time, $t_V$, is shorter than the clock period, $t_{CLK}$. However, when the clock frequency is increased such that the clock period becomes less than the clock to data valid time, the host cannot rely upon a subsequent falling clock edge to latch a new data value.

According to another example, a data valid period, $t_{DV}$, can be identified according to the following:

$$tDV = tCLK + tHO - tV$$

Pursuant to this example, a data valid period is the clock period plus a hold time minus the delay between a falling clock edge and the time at which valid data first presents itself on IO lines. As clock frequencies increase (e.g., $t_{CLK}$ shrinks), the period of time when data is valid, $t_{DV}$, can collapse. For instance, the data valid period can disappear when $t_{CLK}$ becomes smaller than $t_V$ minus $t_{HO}$ (e.g., $t_{CLK} < t_V - t_{HO}$).

Figure 3:
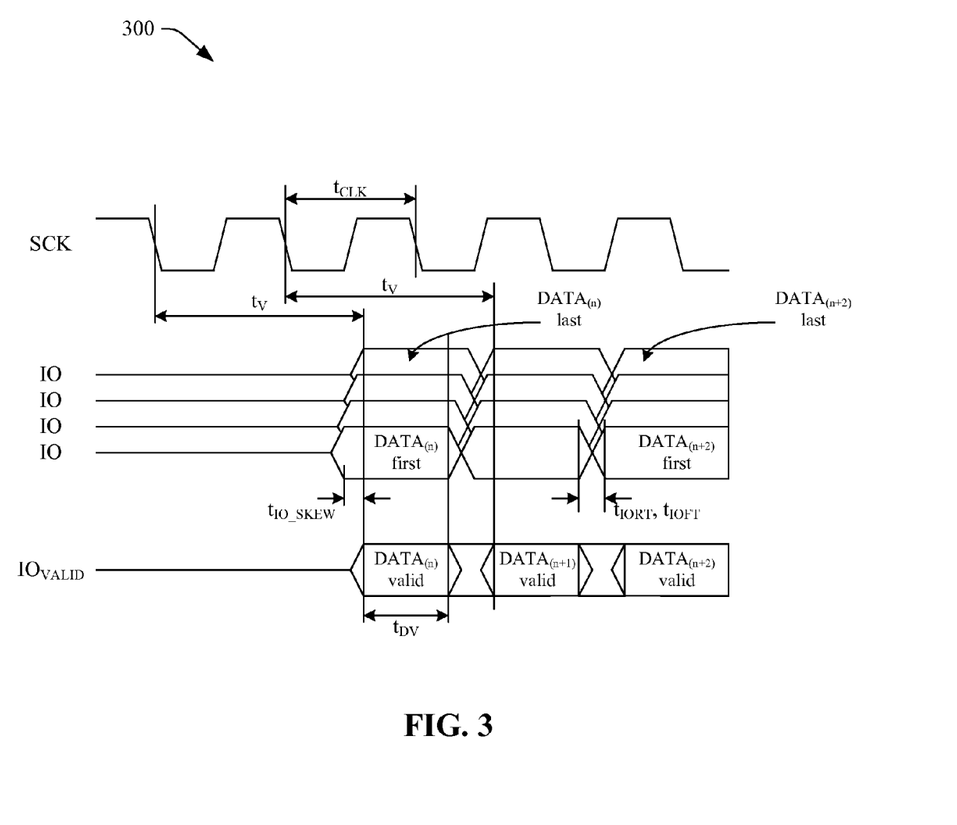
FIG. 3 illustrates an example timing diagram depicting data validity in a multiple input/output implementation according to one or more aspects.

Referring to FIG. 3, an example timing diagram 300 depicting data validity in a multiple input/output implementation according to one or more aspects. In one example, a data valid time, ($t_{DV}$) does not disappear. The hold time ($t_{HO}$) tracks $t_V$ (e.g., data is held unto a next transition) such that the data valid time shifts as depicted in timing diagram 300.

With the elimination of $t_{HO}$ as depicted in timing diagram 300, the data valid period can be determined according to the following:

$$tDV = tCLK(\min) - tIO\_SKEW - tIORT$$

Pursuant to this example, $t_{CLK}$(min) is a minimum clock period and $t_{IO\_SKEW}$ is a time skew between when a first IO data value appears on the bus and when a last data value appears on the bus. For instance, timing diagram 300 illustrates four IO lines. Accordingly, $t_{IO\_SKEW}$ is the time from when a first data value is present on an IO line to when a fourth data value is present on a last IO line, wherein both the first data value and the fourth data value are tied to a same falling clock edge. In the above example, $t_{IORT}$ (or $t_{IOFT}$) is an IO transition time (e.g., a time required for the IO line to rise or fall). With $t_{HO}$ removed from the read operation protocol depicted in timing diagram 300, a hard stop is also removed. The hard stop can limit an upper frequency (e.g., an clock frequency limit) in the legacy SPI bus calculation discussed supra with reference to FIG. 2. Further, the removal of $t_{HO}$ also untethers $t_{DV}$ from a specific clock edge, thus eliminating a deterministic moment (e.g, falling clock edge) at which to capture data.

Figure 4:
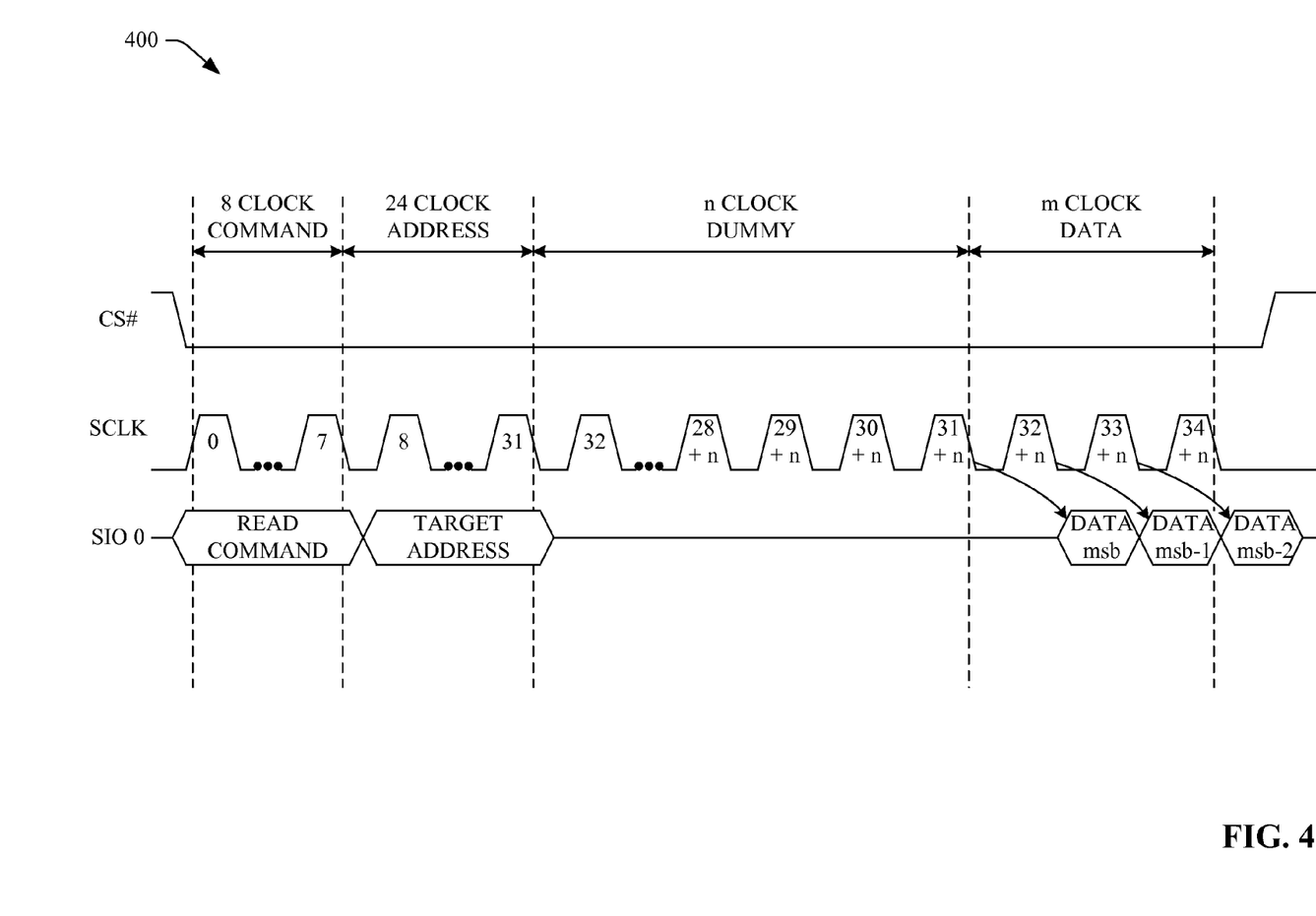
FIG. 4 is an example timing diagram depicting a read operation in accordance with various aspects.

Turning now to FIG. 4, an example timing diagram 400 is illustrated. Timing diagram 400 depicts a read operation on an SPI bus. As illustrated in FIG. 4, timing diagram 400 begins when a host controller specifies a command and an address during the initial portion of a read cycle. While timing diagram 400 depicts the read command having a 8 clock cycle duration and the address having a 24 clock cycle duration, it is to be appreciated that subject matter disclosed and claimed herein is not limited to such delineation. Additional clock cycles and/or fewer clock cycles can be allocated for the read command and the address. After the read command and address, the host controller waits for a memory device to drive target data (e.g., data located at the address provided by the host controller) onto the bus. At higher clock frequencies, several clock cycles can remain unused due to an initial read latency (e.g., a time between the command and address and when data is driven onto the bus). During these dummy clock cycles, no useful information is presented onto the SPI bus. It is to be appreciated that the dummy clock period can have a variable length of n clock cycles, where n is an integer greater than or equal to one. Following the dummy clock period, the memory device drives target data onto the bus. The data period can be variable in length depending on an amount of data requested by the host controller. As shown in timing diagram 400, the data period can be m clock cycles in duration, wherein m is an integer greater than or equal to one.

In accordance with an aspect, the host controller can identify an optimal moment to capture data presented onto the SPI bus by a memory device. To discover the optimal capture time, the host controller observes when valid data is presented on the bus.

Volatile memory devices, such as DRAM devices, having utilized a data training strategy to identify an appropriate data capture point. The data training can be performed once during power-up or periodically during normal operation of the DRAM device. During the training, a host controller associated with the DRAM device reads a known data pattern and skews a capture point across a data valid period. The host controller can determine when data becomes valid and when the data becomes invalid, after which the host controller can select the capture point.

DRAM devices have independent data and command buses, which enables multiple operations to be simultaneously performed. For instance, a precharge operation can occur with one DRAM device while a read operation occurs with a second DRAM device. Further, the DRAM protocol partitions a read address into a bus command that identifies a target row and a second command that identifies a target column. In between the first bus command and the second bus command, the DRAM bus is available for other transactions. However, with data training, the DRAM bus is dedicated to the training and is unavailable for other operations.

In an aspect, the SPI protocol enables a single transaction to be processed on an SPI bus at any given time. When an SPI memory device is enabled (e.g., via CS# transitioning to low), other devices on the bus cannot be accessed until the operation is complete. As discussed above with reference to FIG. 4, during a period between a host issuing a command and address and a memory device driving data onto the bus, information is not presented on the SPI bus. Thus, this period enables a data training pattern to be inserted.

Figure 5:
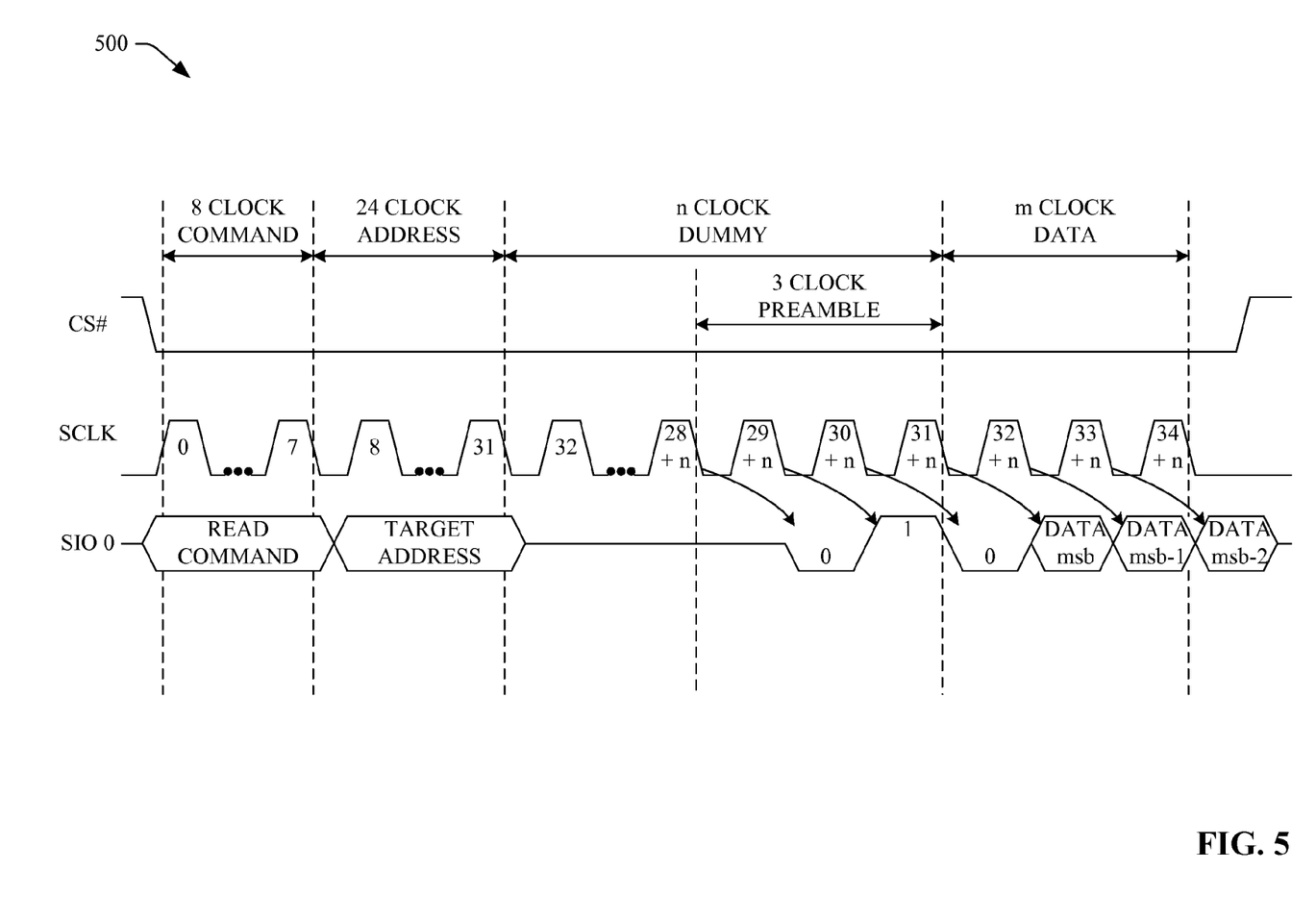
FIG. 5 is an example timing diagram illustrating a read operation that employs a read preamble in accordance with various aspects.

Turning to FIG. 5, an example timing diagram 500 is depicted. Timing diagram 500 illustrates a read operation that employs a read preamble in accordance with various aspects. As illustrated in FIG. 5, timing diagram 500 begins when a host controller specifies a command and an address during the initial portion of a read cycle. While timing diagram 500 depicts the read command having a 8 clock cycle duration and the address having a 24 clock cycle duration, it is to be appreciated that subject matter disclosed and claimed herein is not limited to such delineation. Additional clock cycles and/or fewer clock cycles can be allocated for the read command and the address. After the read command and address, the host controller waits for a memory device to drive target data (e.g., data located at the address provided by the host controller) onto the bus. Following the command and address is a dummy period which can have a variable length of n clock cycles, where n is an integer greater than or equal to one. Following the dummy clock period, the memory device drives target data onto the bus. The data period can be variable in length depending on an amount of data requested by the host controller. As shown in timing diagram 500, the data period can be m clock cycles in duration, wherein m is an integer greater than or equal to one. Moreover, in FIG. 5, an arrow connects a falling clock edge with an associated data bit tied thereto.

According to an example, a memory device can assert a preamble prior to data from a memory array being driven onto the SPI bus. The preamble can be utilized by the host controller to determine a period of time valid data is available on the bus. Once the host controller determines the period in which data is valid, a skew time can be selected to maximize a read timing margin. In an aspect, the preamble can be a known data pattern (e.g., known a priori by the host controller). While timing diagram 500 depicts to the preamble to be three clock pulses in duration and have a pattern of 010, it is to be appreciated that the preamble can be a longer or shorter preamble. In addition, the preamble can be other values in addition to the preamble value illustrated in FIG. 5.

To facilitate explanation, the aspects above are described in connection with an SPI bus. However, it is to be appreciated that preambles can be employed with other bus interfaces such as, but not limited to, Burst NOR, uWire, etc. In addition, the foregoing is presented in terms of a single data rate (SDR) implementation; however, other timing strategies, such as a double data rate (DDR) implementation can be employed.

Figure 6:
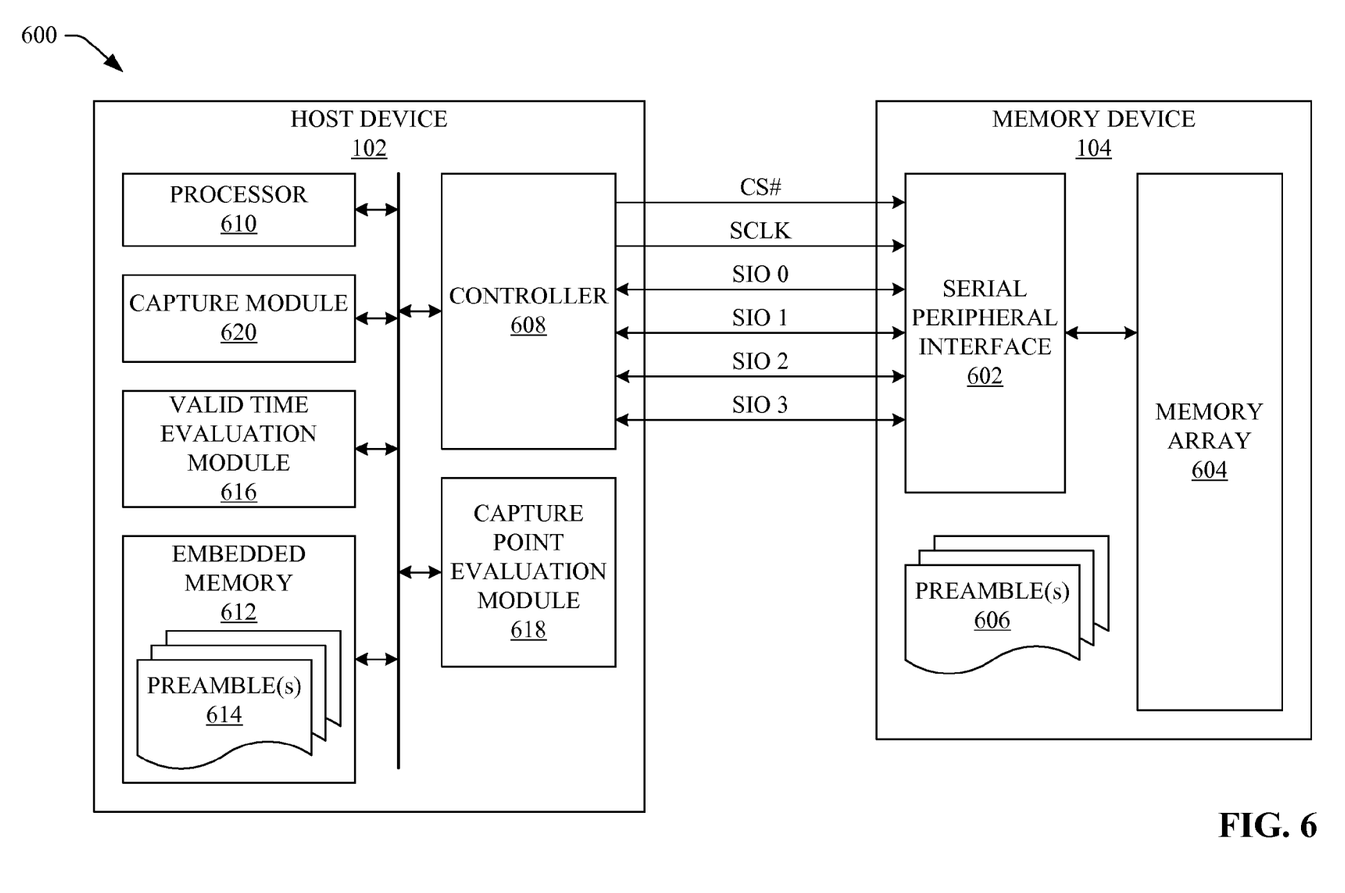
FIG. 6 illustrates a block diagram of a system for employing a read preamble with a serial memory to optimize data capture in accordance with various aspects.

Turning now to FIG. 6, an example system 600 for employing a read preamble with a serial memory to optimize data capture is illustrated. System 600 can include a memory device 104 and a host device 102, which can communicate via a bus, such as an SPI bus. It is to be appreciated that memory device 104 and host device 102 can be similar to and include similar functionality as memory device 104 and host device 102 described above with reference to FIG. 1.

The memory device 104 can include a serial peripheral interface 602 that implements a serial peripheral interface (SPI) protocol. The serial peripheral interface 602 enables the memory device 104 to communicate via the SPI bus in accordance with the SPI protocol. For instance, the serial peripheral interface 602 enables the memory device 104 to be accessed by the SPI bus and, in turn, drive data onto the SPI bus. The SPI bus can include a plurality of routes or lines that carry a variety of signals. For example, the SPI bus can include a chip select line (CS#), a serial clock line (SCLK), and input/output lines (e.g., SIO 0-3). While four input/output lines are depicted in FIG. 6, it is to be appreciated that the SPI bus can include only one input/output line or any other number of input/output lines.

The memory device 104 can also include a memory array 604. The memory array 604 can be non-volatile, solid state memory such as FLASH memory. However, it is to be appreciated that memory array 604 can be any suitable memory such as ROM, DRAM, SDRAM, etc. The serial peripheral interface 602 can access the memory array 604 to obtain data stored therein, to provide data to be stored, to erase data, etc. In another example, memory device 104 can be a non-memory peripheral which does not include memory array 604. For instance, the memory device 104 can be a sensor, a timer, a converter (e.g., analog to digital), etc.

According to an aspect, the memory device 104 can include a preamble 606. The preamble 606 can be a known data pattern having a sequence of one or more bits. The preamble 606 can be output by the memory device 104 during a read operation. For instance, prior to driving data from memory array 604 in accordance with an address obtained on the input/output lines from host device 102, the memory device 104 can drive the preamble 606 onto the input/output lines. The preamble 606 can be output during an idle period (e.g., the dummy clock period from previous figures) of the SPI bus. In one example, the preamble 606 can be output on a single input/output line (e.g., SIO 0). In another example, the preamble 606 can be driven onto two or more input/output lines. In addition, the preamble driven onto multiple lines can be an identical preamble or a set of disparate preambles.

The host device 102 can include a controller 608 that interfaces with the memory device 104 via the SPI bus. The host device 102 can also include a processor 610, such as a central processing unit (CPU) and an embedded memory 612. In one aspect, the embedded memory 612 can retain one or more preamble data patterns 614.

In accordance with an example, the host device 102 can initiate a read operation with memory device 104 via the SPI bus. The controller 608 can output a read command and an address on at least one input/output line of the SPI bus. After the read command and the address, a series of clock pulses can occur without activity while the memory device 104 accesses the memory array 604, obtains and/or buffers target data. During the period of inactivity, the serial peripheral interface 602 of memory device 104 can output preamble 606 onto one or more input/output lines of the SPI bus.

Controller 608 can detect when one or more of the input/output lines of the memory or peripheral device transition out of a tri-state or undriven state, and, subsequently, initiate a training procedure. The preamble data training pattern output by memory device 104 can be known by the host device 102. For example, the preamble can be selected by the host device 102 during a power-up sequence, during the read command, or the like. In another example, the memory device 104 can include a specification that indicates preamble 606 utilized.

During the training procedure, the host device 102 can employ a valid time evaluation module 616 to determine a period of time data is valid on the SPI bus. In accordance with an example, the valid time evaluation module 616 can utilize a known preamble data pattern 614 corresponding to preamble 606 and observe the input/output line(s) of the SPI bus transition in accordance with the preamble data pattern 614. In one aspect, a clock frequency of processor 610 and/or the host device 102 can be higher than a frequency of the serial clock (SCLK) of the SPI bus. However, it is to be appreciated that other capture techniques can be utilized in concert with or in place of a higher host clock frequency. Accordingly, the host device 102 can sample the input/output lines of the SPI bus multiple times during each clock pulse of the serial clock.

The valid time evaluation module 616 can identify a time when each bit of preamble 614 becomes valid and a time when the each bit goes invalid. These times can be recorded for each bit presented during the preamble period. In one example, a difference between the times a bit becomes valid and then goes invalid can be a valid data period. The valid time evaluation module 616 can statistically combine the valid data periods of all bits of preamble 614. For instance, the valid time evaluation module 616 can determine an average valid data period.

In another aspect, a capture point evaluation module 618 of host device 102 can utilize the average valid data period to determine an optimal capture point. The optimal capture point can be a skew time from a falling clock edge, or other reference, which maximizes a margin for reading the data on the input/output lines. A capture module 620 can be configured in accordance with the optimal capture point. For instance, the capture module 620 can be configured to sample data on the input/output lines of the SPI bus at the optimal capture point following a falling clock edge of the serial clock.

In one example, the training procedure described above can be performed prior to every read operation. For instance, variance in temperature and voltage during a read operation can be minimal such that the optimal capture point need not be updated. However, between adjacent read operations, a valid data window can shift such that recalibration is recommended.

FIG. 6 depicts the valid time evaluation module 616, the capture point evaluation module 618, and the capture module 620 as separate entities on an internal bus. However, it is to be appreciated that the aforementioned components can be incorporated into a single entity, and/or incorporated into the controller 608. Moreover, system 600 can be a single data rate environment or a double data rate environment.

Figure 7:
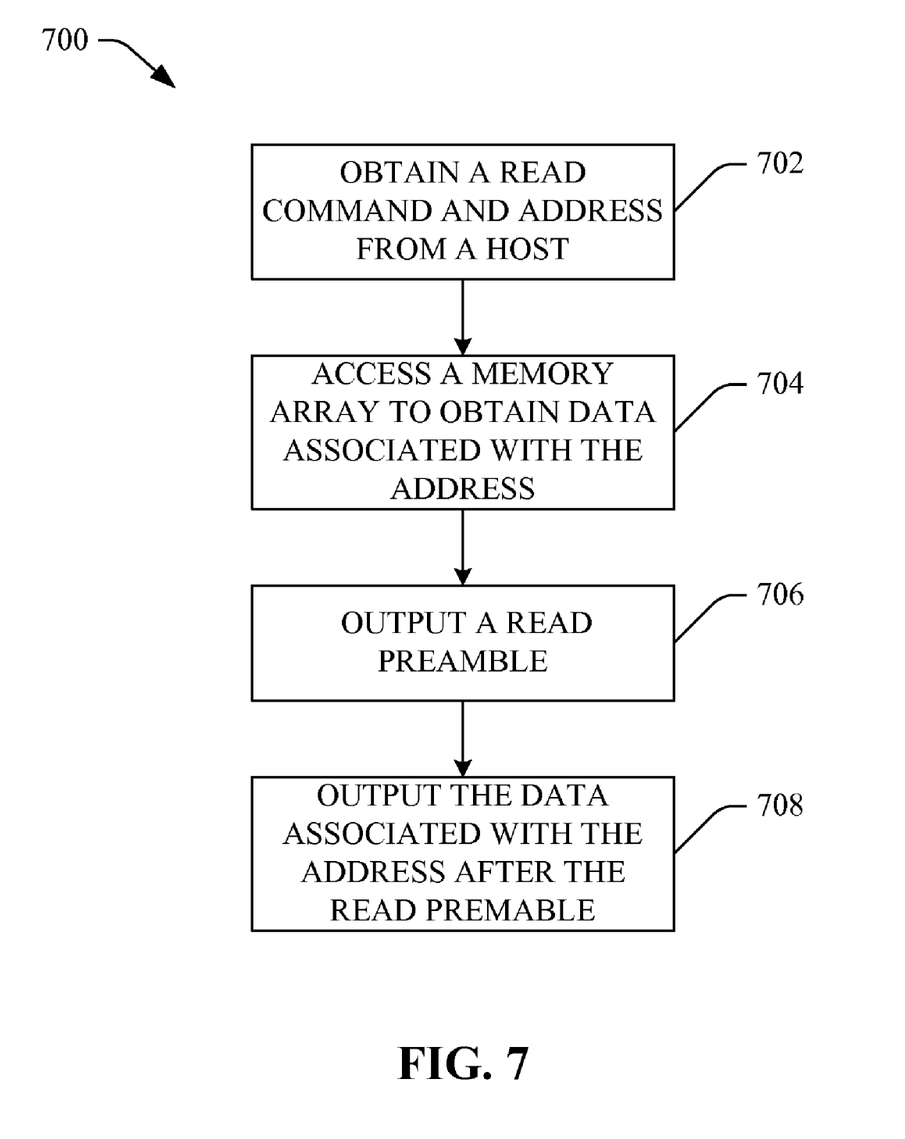
FIG. 7 is a flow diagram of an example methodology for employing a read preamble prior to a data read operation.
Figure 8:
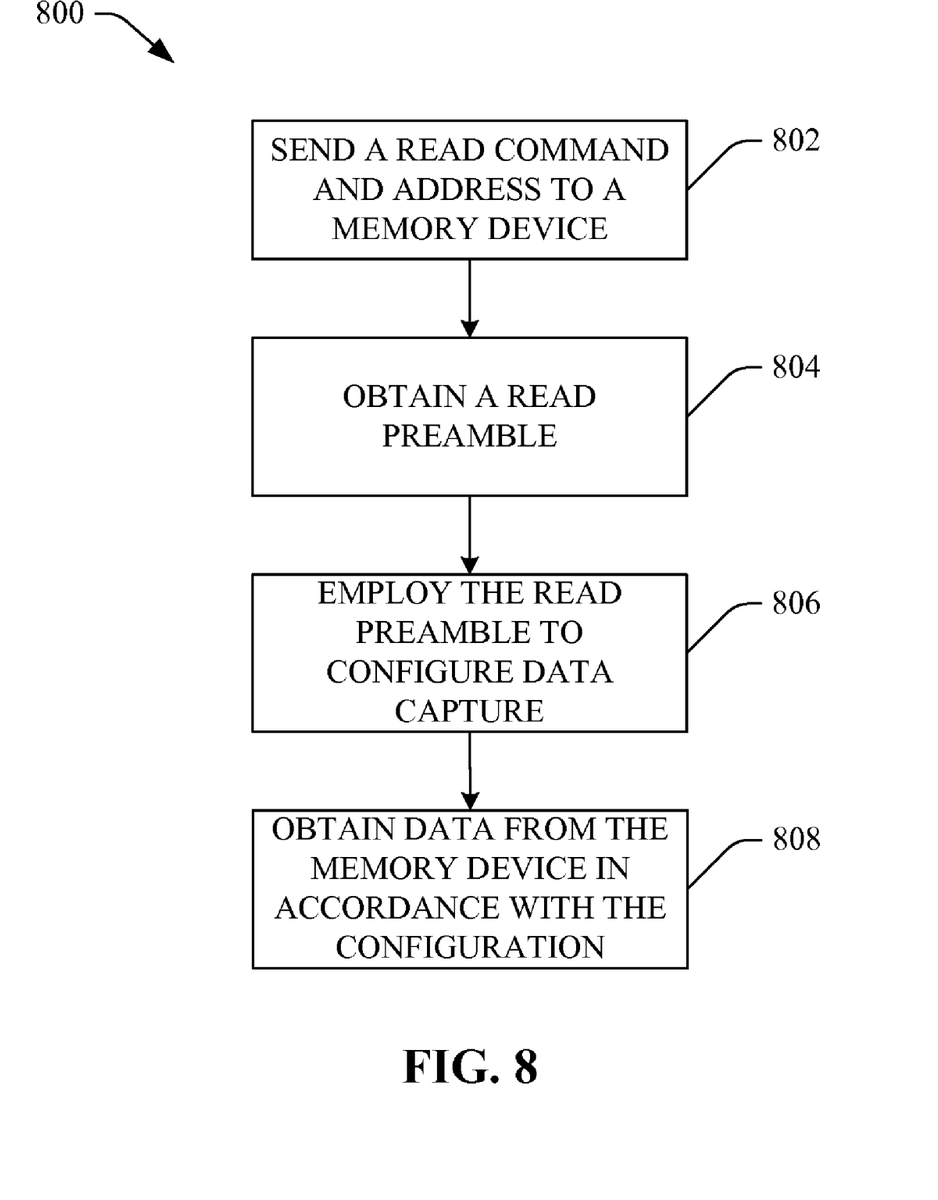
FIG. 8 is a flow diagram of an example methodology for utilizing a read preamble to optimize data capture for a data read operation.

FIGS. 7-8 illustrate example process methodologies for utilizing a preamble during read operations to select a capture point. While, for purposes of simplicity of explanation, the processes or methodologies are shown and described as a series or number of acts, it is to be understood and appreciated that the subject processes are not limited by the order of acts, as some acts may, in accordance with the subject processes, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the subject processes described herein.

Referring to FIG. 7, a method 700 for employing a read preamble prior to a data read operation is illustrated. In one aspect, method 700 can be employed by a memory device to facilitate training of a host device. In addition, the memory device and the host device can utilize a serial peripheral interface (SPI) protocol and bus to communicate. At reference numeral 702, a read command and an address is obtained from a host. At reference numeral 704, a memory array can be accessed to obtain data associated with the address. In one example, a latency period can transpire while the memory array is accessed. At reference numeral 706, during the latency period and prior to driving the data from the memory array, a read preamble can be output on the SPI bus. The read preamble can be a known pattern or one or more bits. At reference numeral 708, the data associated with the address can be output after the read preamble.

FIG. 8 depicts a method 800 for utilizing a read preamble to optimize data capture for a data read operation. In one example, method 800 can be employed by a host device communicating with a memory device, wherein the memory device and host device utilize a SPI bus and protocol. At reference numeral 802, a read command and address are sent to a memory device. For instance, an SPI bus, and more particular, input/output lines of the SPI bus can be utilized to convey the command and address. At reference numeral 804, a read preamble is obtained. In one example, the read preamble can be obtained during a latency period while the memory device accesses data requested. The read preamble can include a known data pattern comprising a sequence of one or more bits. At reference numeral 806, the read preamble can be employed to configure data capture. According to an example, data, including the read preamble, is output on an input/output line of the SPI bus after some time following a falling clock edge. The time between points when a bit of the read preamble becomes valid and when the bit goes invalid can be observed. This time can be utilized to identify a valid data window. A capture point can be selected within the valid data window to maximize a read margin. At reference numeral 808, data is obtained from the memory device. In an aspect, the data is driven on the SPI bus by the memory device and the host device samples the data on the bus in accordance with the capture point configured.

Figure 9:
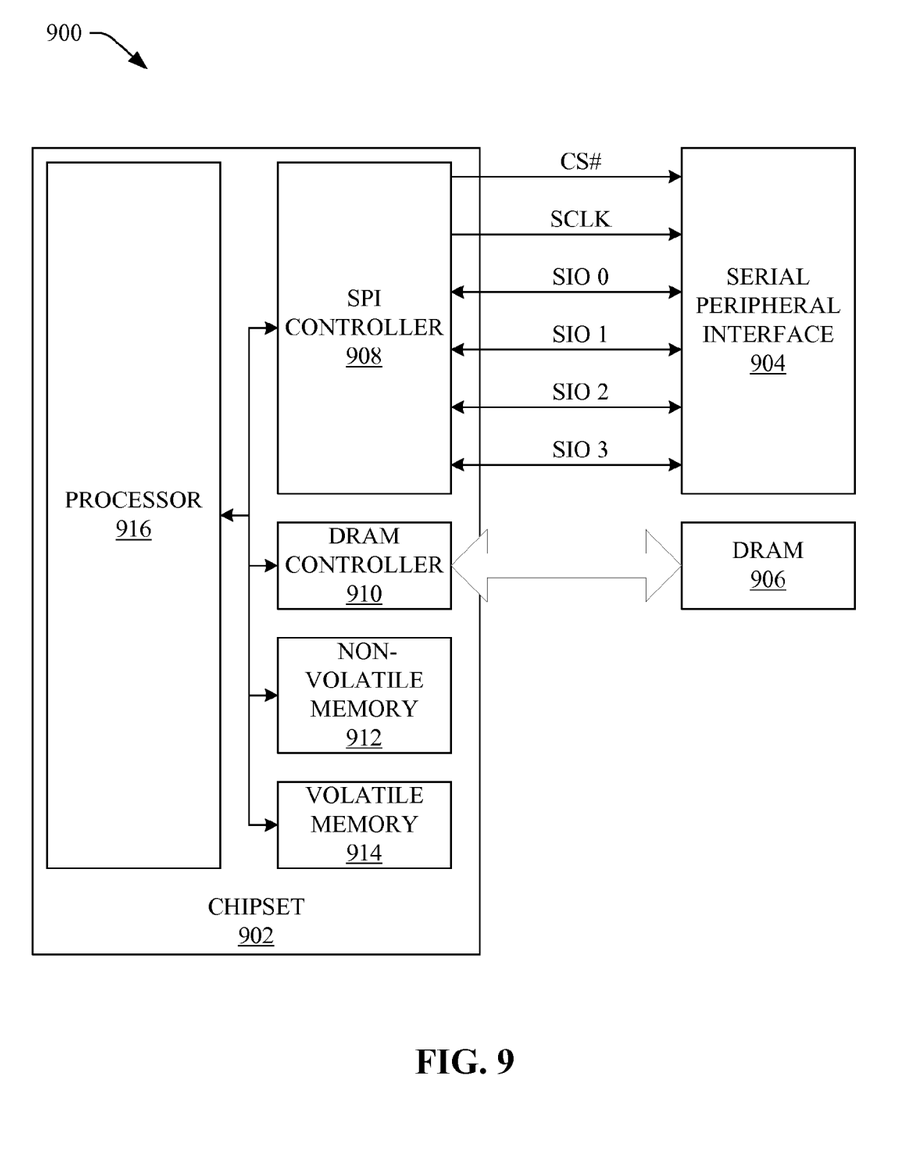
FIG. 9 is a block diagram of an example system that can employ a serial memory.

Referring to FIG. 9, illustrated is a block diagram of an exemplary, non-limiting system 900 that can comprise and/or incorporate system 100, system 600, or a respective portion(s) thereof, and/or implement methodology 700, and/or methodology 800, or respective portions thereof. System 900 can implement a serial peripheral interface between a chipset 902 and a serial peripheral interface 904. In accordance with an example, the chipset 902 can be incorporated into an electronic device such as, but not limited to, a computer, a laptop computer, network equipment (e.g., routers, access points), a media player and/or recorder (e.g., audio player and/or recorder, video player and/or recorder), a television, a smart card, a phone, a cellular phone, a smart phone, an electronic organizer, a PDA, a portable email reader, a digital camera, an electronic game (e.g., video game), an electronic device associated with digital rights management, a Personal Computer Memory Card International Association (PCMCIA) card, a trusted platform module (TPM), a Hardware Security Module (HSM), set-top boxes, a digital video recorder, a gaming console, a navigation system or device (e.g., global position satellite (GPS) system), a secure memory device with computational capabilities, a device with a tamper-resistant chip(s), an electronic device associated with an industrial control system, an embedded computer in a machine (e.g., an airplane, a copier, a motor vehicle, a microwave oven), and the like. In another example, the serial peripheral interface 904 can be a memory device or a non-memory peripheral device.

The chipset 902 can include an SPI controller 908 which can communicate with the serial peripheral interface 904 via a SPI bus. The SPI bus can include a variety of signal lines, routes and/or pins. For instance, the SPI can include a chip select line (e.g., CS#) that enables the SPI controller to select the serial peripheral interface 904, a serial clock (SCLK) line that provides a clock signal as a reference to implement an SPI protocol, and one or more input/output lines (SIO 0-3) that carry command and data signals between the serial peripheral interface 904 and the chipset 902.

System 900 can also include a volatile memory device such as DRAM 906 communicatively coupled via a DRAM bus to a DRAM controller 910. The DRAM controller can utilize a DRAM protocol to enable chipset 902 to access and employ DRAM 906. In addition, chipset 902 can include a variety of a variety of computer-readable media. Computer-readable media can be any available media that can be accessed by the chipset 902. By way of example, and not limitation, computer-readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, nonvolatile memory (e.g., FLASH memory), or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by chipset 902. Communication media typically embodies computer readable instructions, data structures, program modules or other data in a modulated data signal such as a carrier wave or other transport mechanism and includes any information delivery media. In one example, chipset 902 can include an embedded non-volatile memory 912 and an embedded volatile memory 914.

The non-volatile memory 912 can be removable or non-removable. For example, the non-volatile memory 912 can be in the form of a removable memory card or a USB FLASH drive. In accordance with one aspect, the non-volatile memory 912 can include FLASH memory (e.g., single-bit FLASH memory, multi-bit FLASH memory), ROM, PROM, EPROM, EEPROM, or NVRAM (e.g., FeRAM), or a combination thereof, for example. Further, a FLASH memory can comprise NOR FLASH memory and/or NAND FLASH memory. In accordance with another aspect, the non-volatile memory 912 can comprise one or more memory components. The volatile memory 912 can include RAM, DRAM, SRAM, SDRAM, RDRAM, and the like.

A basic input/output system (BIOS), containing the basic routines that can facilitate transferring information between elements within chipset 902, such as during start-up, can be stored in the non-volatile memory 912 and/or the volatile memory 914. The non-volatile memory 912 and/or the volatile memory 914 can also contain data and/or program modules that can be accessible to and/or presently be operated on by a processor 916. By way of example, and not limitation, the non-volatile memory 912 and/or the volatile memory 914 can also include an operating system(s), application programs, other program modules, and program data. In addition, the non-volatile memory 912 and/or the volatile memory 914 can include code (e.g., bootstrapping code) that enables the chipset 902 to access a memory (not shown) associated with the serial peripheral interface 904 to obtain operating system code, application code, or other data and shadow the obtained information to the volatile memory 914 and/or DRAM 906.

It is to be understood and appreciated that the computer-implemented programs and software can be implemented within a standard computer architecture. While some aspects of the disclosure have been described above in the general context of computer-executable instructions that can be run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA, phone), microprocessor-based or programmable consumer electronics, and the like, each of which can be operatively coupled to one or more associated devices.

The illustrated aspects of the disclosure may also be practiced in distributed computing environments where certain tasks are performed by remote processing devices that are linked through a communications network. In a distributed computing environment, program modules can be located in both local and remote memory storage devices.

It is also to be understood and appreciated that cryptographic protocols can be employed to facilitate security of data associated with a memory (e.g., memory device 104) in accordance with the disclosed subject matter. For example, a cryptographic component (e.g., cryptographic engine) can be employed and can facilitate encrypting and/or decrypting data to facilitate securing data being written to, stored in, and/or read from the memory. The cryptographic component can provide symmetric cryptographic tools and accelerators (e.g., Twofish, Blowfish, AES, TDES, IDEA, CASTS, RC4, etc.) to facilitate data security. The cryptographic component can also provide asymmetric cryptographic accelerators and tools (e.g., RSA, Digital Signature Standard (DSS), and the like) to facilitate securing data. Additionally, the cryptographic component can provide accelerators and tools (e.g., Secure Hash Algorithm (SHA) and its variants such as, for example, SHA-0, SHA-1, SHA-224, SHA-256, SHA-384, and SHA-512) to facilitate data security.

It is to be appreciated and understood that authentication protocols can be employed to facilitate security of data associated with the memory (e.g., memory component 102) in accordance with the disclosed subject matter. For example, an authentication component can solicit authentication data from an entity, and, upon the authentication data so solicited, can be employed, individually and/or in conjunction with information acquired and ascertained as a result of biometric modalities employed, to facilitate control access to the memory. The authentication data can be in the form of a password (e.g., a sequence of humanly cognizable characters), a pass phrase (e.g., a sequence of alphanumeric characters that can be similar to a typical password but is conventionally of greater length and contains non-humanly cognizable characters in addition to humanly cognizable characters), a pass code (e.g., Personal Identification Number (PIN)), and the like, for example. Additionally and/or alternatively, public key infrastructure (PKI) data can also be employed by the authentication component. PKI arrangements can provide for trusted third parties to vet, and affirm, entity identity through the use of public keys that typically can be certificates issued by the trusted third parties. Such arrangements can enable entities to be authenticated to each other, and to use information in certificates (e.g., public keys) and private keys, session keys, Traffic Encryption Keys (TEKs), cryptographic-system-specific keys, and/or other keys, to encrypt and decrypt messages communicated between entities.

The authentication component can implement one or more machine-implemented techniques to identify an entity by its unique physical and behavioral characteristics and attributes. Biometric modalities that can be employed can include, for example, face recognition wherein measurements of key points on an entity's face can provide a unique pattern that can be associated with the entity, iris recognition that measures from the outer edge towards the pupil the patterns associated with the colored part of the eye—the iris—to detect unique features associated with an entity's iris, and finger print identification that scans the corrugated ridges of skin that are non-continuous and form a pattern that can provide distinguishing features to identify an entity.

As utilized herein, terms "component," "system," "interface," and the like, are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and FLASH memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system for employing a read preamble, comprising:
a memory device, comprising:
a memory array that retains information;
a serial peripheral interface configured to communicate with a host with a serial peripheral interface protocol, wherein the serial peripheral interface outputs a read preamble on a serial peripheral interface bus prior to output of data bits stored in the memory array; and
a host device that includes a valid time evaluation module that observes output of the read preamble to determine a valid data window.

2. The system of claim 1, wherein the host device utilizes the read preamble to determine an optimal data capture moment.

3. The system of claim 2, wherein the host device comprises:
a controller configured to communicate with the memory device via the serial peripheral interface bus; and
a capture module that samples data bits output to the serial peripheral interface bus by the memory device.

4. The system of claim 3, wherein the host device further comprises:
a capture point evaluation module that selects a capture point within the valid data window.

5. The system of claim 4, wherein the host device configures the capture module to sample data bits in accordance with the capture point within the valid data window.

6. The system of claim 2, wherein the read preamble comprises a data pattern known to the memory device and the host device.

7. The system of claim 1, wherein the read preamble includes a sequence of one or more bits.

8. A system for utilizing a read preamble on a serial peripheral interface bus, comprising:
means for observing a read preamble driven onto the serial peripheral interface bus;
means for identifying a first time at which a bit of the read preamble becomes valid on the serial peripheral interface bus and a second time at which the bit goes invalid;
means for selecting a moment between the first time and the second time; and
means for employing the moment as a skew to optimize data capture.

9. The system of claim 8, wherein the read preamble is a known data pattern output during a latency period and is driven onto the bus prior to data from a memory array.

10. A method for employing a read preamble, comprising:
receiving a command on a bus;
receiving an address on a bus;
accessing a memory array to obtain data associated with the address;
outputting a read preamble on an input/output signal line, wherein the read preamble enables a host device to determine an optimal capture time;
determining a valid data window by identifying a first point when a bit of the read preamble becomes valid and identifying a second point when the bit of the read preamble goes invalid; and
outputting the data obtained from the memory array on the input/output signal line, wherein outputting the data occurs after outputting the read preamble.

11. The method of claim 1, wherein the bus is a serial peripheral interface bus.

12. The method of claim 1, wherein the read preamble comprises a known data pattern, wherein the known data pattern includes a sequence of one or more bits.

13. The method of claim 1, wherein the memory array comprises a FLASH memory array.

14. The method of claim 1, further comprising determining an optimal capture time based upon the read preamble.

15. The method of claim 14, wherein determining the optimal capture time comprises identifying the valid data window.

16. The method of claim 15, further comprising selecting a skew time, wherein the skew time is a time duration from a reference point.

17. The method of claim 16, wherein the reference point is at least one of a falling edge of a clock signal or a rising edge of the clock signal.

18. The method of claim 16, wherein the skew time maximizes a read margin within the valid data window.

19. The method of claim 16, further comprising sampling data on the input/output signal line in accordance with the skew time.

* * * * *